United States Patent
Hirase et al.

(10) Patent No.: US 12,342,092 B2
(45) Date of Patent: Jun. 24, 2025

(54) IMAGING APPARATUS

(71) Applicant: Panasonic Intellectual Property Management Co., Ltd., Osaka (JP)

(72) Inventors: Junji Hirase, Osaka (JP); Takayoshi Yamada, Hyogo (JP); Kazuko Nishimura, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 79 days.

(21) Appl. No.: 18/346,757

(22) Filed: Jul. 3, 2023

(65) Prior Publication Data

US 2024/0171877 A1  May 23, 2024

Related U.S. Application Data

(63) Continuation of application No. PCT/JP2021/048521, filed on Dec. 27, 2021.

(30) Foreign Application Priority Data

Jan. 15, 2021 (JP) .................. 2021-005353

(51) Int. Cl.
*H04N 25/77* (2023.01)
*H04N 23/667* (2023.01)
(Continued)

(52) U.S. Cl.
CPC ........... *H04N 25/77* (2023.01); *H04N 23/667* (2023.01); *H04N 25/57* (2023.01); *H04N 25/60* (2023.01)

(58) Field of Classification Search
CPC ........ H04N 25/77; H04N 25/57; H04N 25/60; H04N 23/667; H04N 25/571; H04N 25/59;
(Continued)

(56) References Cited

U.S. PATENT DOCUMENTS

| 6,069,376 A | 5/2000 | Merrill |
| 9,711,558 B2 | 7/2017 | Sato et al. |

(Continued)

FOREIGN PATENT DOCUMENTS

| JP | 2010-171439 | 8/2010 |
| JP | 2018-117347 | 7/2018 |
| WO | 2020/144910 A1 | 7/2020 |

OTHER PUBLICATIONS

The EPC Office Action dated Jul. 12, 2024 for the related European Patent Application No. 21919742.3.
(Continued)

*Primary Examiner* — Marly S Camargo
(74) *Attorney, Agent, or Firm* — Rimon P.C.

(57) ABSTRACT

An imaging apparatus includes: a photoelectric converter that generates charge through photoelectric conversion; a charge accumulator in which the charge is accumulated; and a metal-oxide-semiconductor capacitor including a first terminal, a second terminal, a gate, an oxide layer, and at least one semiconductor region. During exposure, the first terminal is electrically connected to the charge accumulator. The gate is electrically connected to the first terminal. The at least one semiconductor region is electrically connected to the second terminal. The oxide layer is located between the gate and the at least one semiconductor region.

19 Claims, 4 Drawing Sheets

(51) Int. Cl.
  *H04N 25/57*  (2023.01)
  *H04N 25/59*  (2023.01)
  *H04N 25/60*  (2023.01)
  *H04N 25/63*  (2023.01)
  *H04N 25/65*  (2023.01)

(58) Field of Classification Search
  CPC .............. H04N 25/65; H01L 27/14609; H01L 27/14665; H10F 39/191; H10F 39/803
  See application file for complete search history.

(56) References Cited

U.S. PATENT DOCUMENTS

| | | | |
|---|---|---|---|
| 10,186,534 B2* | 1/2019 | Maes | H10F 39/1898 |
| 12,094,895 B2* | 9/2024 | Hirase | H10F 39/8033 |
| 2015/0194458 A1* | 7/2015 | Furukawa | H10D 30/65 |
| | | | 257/292 |
| 2018/0151742 A1* | 5/2018 | Kurata | H10D 30/68 |
| 2018/0205896 A1 | 7/2018 | Nishimura et al. | |
| 2021/0185249 A1 | 6/2021 | Murakami et al. | |

OTHER PUBLICATIONS

International Search Report of PCT application No. PCT/JP2021/048521 dated Feb. 22, 2022.

* cited by examiner

IMAGING APPARATUS

BACKGROUND

1. Technical Field

The present disclosure relates to an imaging apparatus.

2. Description of the Related Art

Image sensors are used in digital cameras and the like. Image sensors include charge coupled device (CCD) image sensors, complementary metal oxide semiconductor (CMOS) image sensors, and the like.

In an image sensor according to one example, a photodiode is provided in a semiconductor substrate.

In an image sensor according to another example, a photoelectric conversion layer is provided above a semiconductor substrate. An imaging apparatus having such a structure may be referred to as a stacked imaging apparatus. Japanese Unexamined Patent Application Publication No. 2010-171439 and Japanese Unexamined Patent Application Publication No. 2018-117347 describe stacked imaging apparatuses.

In a stacked imaging apparatus according to one specific example, signal charge is generated through photoelectric conversion. The charge thus generated is accumulated in a charge accumulator. A signal corresponding to the amount of charge accumulated in the charge accumulator is read out through a CCD circuit or a CMOS circuit formed in a semiconductor substrate.

SUMMARY

In one general aspect, the techniques disclosed here feature an imaging apparatus including: a photoelectric converter that generates charge through photoelectric conversion; a charge accumulator in which the charge is accumulated; and a metal-oxide-semiconductor capacitor including a first terminal, a second terminal, a gate, an oxide layer, and at least one semiconductor region. During exposure, the first terminal is electrically connected to the charge accumulator. The gate is electrically connected to the first terminal. The at least one semiconductor region is electrically connected to the second terminal. The oxide layer is located between the gate and the at least one semiconductor region.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Figure 1:
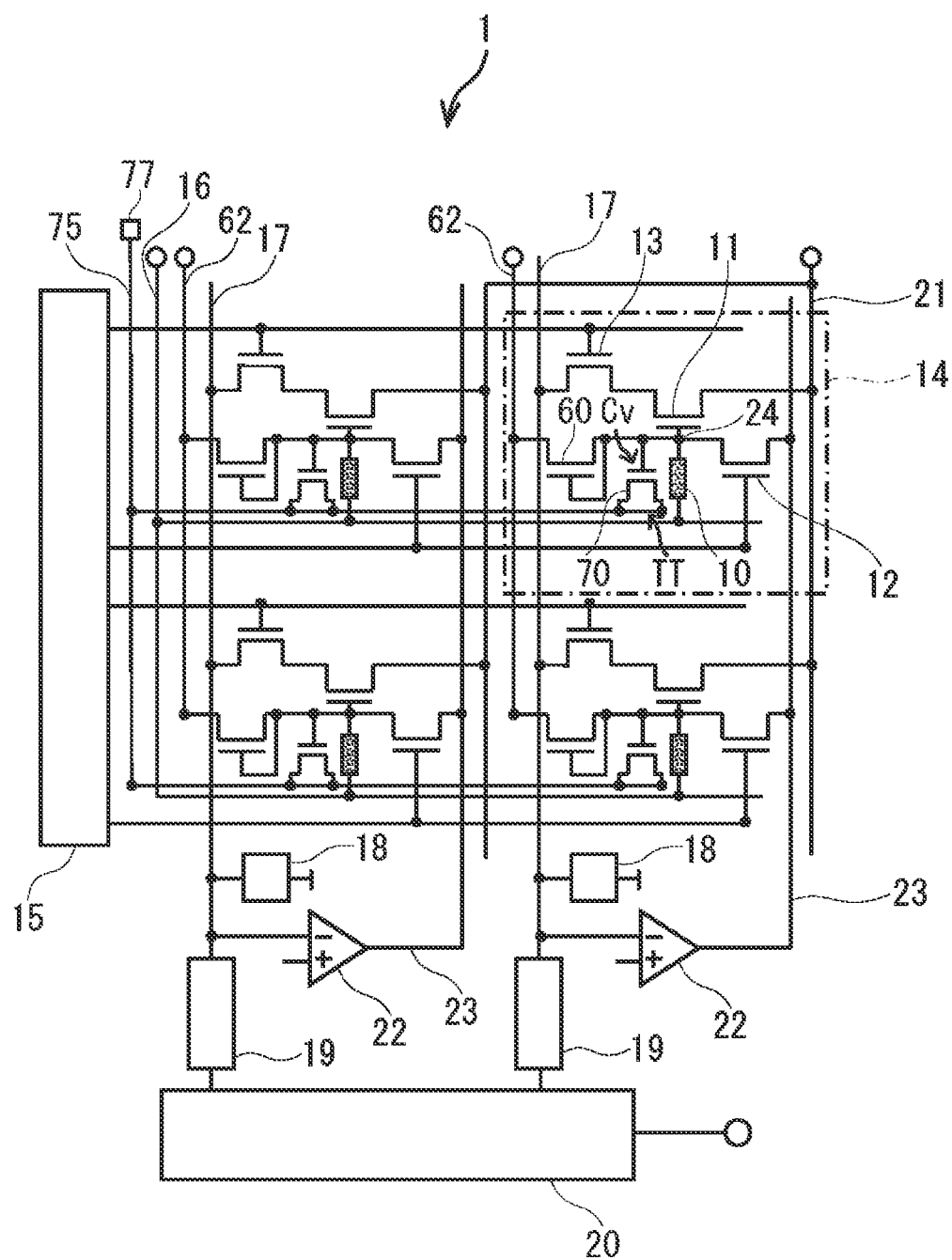
FIG. 1 is a schematic diagram showing a circuit configuration of an imaging apparatus according to a first embodiment.

Summary of Some Aspects According to the Present Disclosure

An imaging apparatus according to a first aspect of the present disclosure includes:
- a photoelectric converter that generates charge through photoelectric conversion;
- a charge accumulator in which the charge is accumulated; and
- a metal-oxide-semiconductor capacitor including a first terminal, a second terminal, a gate, an oxide layer, and at least one semiconductor region. During exposure, the first terminal is electrically connected to the charge accumulator. The gate is electrically connected to the first terminal. The at least one semiconductor region is electrically connected to the second terminal. The oxide layer is located between the gate and the at least one semiconductor region.

The technique according to the first aspect is suitable for achieving a wide dynamic range while ensuring a S/N ratio at an intermediate illuminance.

In a second aspect of the present disclosure, for example, in the imaging apparatus according to the first aspect,
- a capacitance value of the metal-oxide-semiconductor capacitor may continuously change in accordance with a potential of the charge accumulator.

The technique according to the second aspect is suitable for achieving a wide dynamic range while ensuring a S/N ratio at an intermediate illuminance.

In a third aspect of the present disclosure, for example, in the imaging apparatus according to the first or second aspect,
- a C-V characteristic that is defined as a relation of a capacitance value of the metal-oxide-semiconductor capacitor to an inter-terminal voltage may include an inflection point, the inter-terminal voltage being a voltage between the first terminal and the second terminal, and
- when a potential of the charge accumulator continuously changes, the inter-terminal voltage and the capacitance value may continuously change across the inflection point.

According to the third aspect, it is easy to largely change the capacitance value of the metal-oxide-semiconductor capacitor in accordance with the change in the potential of the charge accumulator.

In a fourth aspect of the present disclosure, for example, the imaging apparatus according to the third aspect may further include a setter that sets a range within which the potential of the charge accumulator changes to a range from a first potential to a second potential,
- the C-V characteristic may include a first band including the inflection point, and
- when the potential of the charge accumulator changes from the first potential to the second potential, the inter-terminal voltage and the capacitance value may change from the inter-terminal voltage and the capacitance value at a first end of the first band to the inter-terminal voltage and the capacitance value at a second end of the first band.

The fourth aspect is one example of a configuration of the imaging apparatus.

In a fifth aspect of the present disclosure, for example, in the imaging apparatus according to any one of the first to fourth aspects, a first direct current potential may be applied to the second terminal such that a capacitance value of the metal-oxide-semiconductor capacitor continuously changes in accordance with an inter-terminal voltage that is a voltage between the first terminal and the second terminal.

According to the fifth aspect, the structure of the imaging apparatus can be simplified.

In a sixth aspect of the present disclosure, for example, in the imaging apparatus according to any one of the first to fifth aspects, a C-V characteristic that is defined as a relation of a capacitance value of the metal-oxide-semiconductor capacitor to an inter-terminal voltage may include a first band and a second band, the inter-terminal voltage being a voltage between the first terminal and the second terminal, the capacitance value in the second band may be smaller than the capacitance value in the first band, an absolute value of a proportion of a change in the capacitance value to a change in the inter-terminal voltage in the second band may be smaller than an absolute value of a proportion of a change in the capacitance value to a change in the inter-terminal voltage in the first band, imaging modes of the imaging apparatus may include a first mode and a second mode, in the first mode, a potential may be applied to the second terminal such that when a potential of the charge accumulator changes, the inter-terminal voltage changes within the first band, and in the second mode, a potential may be applied to the second terminal such that when the potential of the charge accumulator changes, the inter-terminal voltage changes within the second band.

In the second mode of the sixth aspect, it is easy to suppress at least one selected from a variation in noise and a variation in signal.

The charge may be positive charge, and the potential of the second terminal in the second mode may be higher than the potential of the second terminal in the first mode. In addition, the charge may be negative charge, and the potential of the second terminal in the second mode may be lower than the potential of the second terminal in the first mode.

In a seventh aspect of the present disclosure, for example, in the imaging apparatus according to any one of the first to sixth aspects, a C-V characteristic that is defined as a relation of a capacitance value of the metal-oxide-semiconductor capacitor to an inter-terminal voltage may include a first band and a third band, the inter-terminal voltage being a voltage between the first terminal and the second terminal, the capacitance value in the third band may be larger than the capacitance value in the first band, an absolute value of a proportion of a change in the capacitance value to a change in the inter-terminal voltage in the third band may be smaller than an absolute value of a proportion of a change in the capacitance value to a change in the inter-terminal voltage in the first band, imaging modes of the imaging apparatus may include a first mode and a third mode, in the first mode, a potential may be applied to the second terminal such that when a potential of the charge accumulator changes, the inter-terminal voltage changes within the first band, and in the third mode, a potential may be applied to the second terminal such that when the potential of the charge accumulator changes, the inter-terminal voltage changes within the third band.

In the third mode of the seventh aspect, it is easy to suppress at least one selected from a variation in noise and a variation in signal.

The charge may be positive charge, and the potential of the second terminal in the third mode may be lower than the potential of the second terminal in the first mode. In addition, the charge may be negative charge, and the potential of the second terminal in the third mode may be higher than the potential of the second terminal in the first mode.

In an eighth aspect of the present disclosure, for example, the imaging apparatus according to any one of the first to seventh aspects may further include an amplification transistor that outputs an output signal corresponding to a potential of the charge accumulator, and the imaging apparatus may switch a potential to be applied to the second terminal in accordance with the output signal.

According to the eighth aspect, the imaging mode can be switched.

In a ninth aspect of the present disclosure, for example, the imaging apparatus according to any one of the first to eighth aspects may further include:

a voltage source that applies a potential to the second terminal.

The ninth aspect is one example of a configuration of the imaging apparatus.

In a tenth aspect of the present disclosure, for example, the imaging apparatus according to any one of the first to ninth aspects may further include a semiconductor substrate including the at least one semiconductor region, and the photoelectric converter may be separate from the semiconductor substrate.

According to the configuration of the tenth aspect, the photoelectric converter is less likely to affect the capacitance value of the metal-oxide-semiconductor capacitor than a configuration in which the photoelectric converter is a photodiode provided in the semiconductor substrate.

An imaging apparatus according to an eleventh aspect of the present disclosure includes:

a charge accumulator in which charge generated through photoelectric conversion is accumulated; and a transistor that includes a source region and a drain region electrically connected to each other. The transistor functions as a metal-oxide-semiconductor capacitor including a first terminal that is electrically connected to the charge accumulator during exposure.

The technique according to the eleventh aspect is suitable for achieving a wide dynamic range while ensuring a S/N ratio at an intermediate illuminance.

An imaging apparatus according to a twelfth aspect of the present disclosure includes:

a charge accumulator in which charge generated through photoelectric conversion is accumulated; and a metal-oxide-semiconductor capacitor including a first terminal, an oxide layer, and a source/drain region. The first terminal is electrically connected to the charge accumulator during exposure.

In embodiments, the terms "top", "bottom", and the like are only used to designate the arrangement of members relative to each other, and are not intended to limit the orientation of the imaging apparatus in use.

In the embodiments, adjustment of each element associated with a difference in the polarity of signal charge, such as change of the conductivity type of an impurity region, may be conducted as appropriate. In addition, replacement of terms associated with a difference in the polarity of signal charge may be conducted as appropriate.

In the following embodiments, it is possible to use the expression "a charge accumulator is electrically connected to an element X". Specifically, in the following embodiments, even in a case where a charge accumulator is formed by part or all of an element X, it is possible to use the above-described expression. For this reason, the above-described expression should be construed as an expression that encompasses the case where the charge accumulator is formed by part or all of the element X. In addition, in the following embodiments, it is possible to list a charge accumulator and another element like "having/including a charge accumulator and an element X". Specifically, in the following embodiments, even in the case where the charge accumulator is formed by part or all of the element X, it is possible to make such listing. In a situation where such listing has been made, a configuration in which the charge accumulator is formed by part or all of the element X should be accepted. For example, in the following embodiments, one of a source and a drain of an overflow transistor may form a charge accumulator. One of a source and a drain of a reset transistor may form a charge accumulator. A photoelectric converter may form a charge accumulator.

In the following embodiments, it is possible to use the expression "having/including a MOS capacitor and a specific transistor". This expression should be construed as an expression that encompasses a case where the MOS capacitor is formed by using the specific transistor. In other words, this expression should be construed as an expression that encompasses a case where the MOS capacitor and the specific transistor overlap partially or entirely.

In the embodiments, ordinals such as first, second, third, . . . may be used. In a case where an ordinal is attached to a certain element, it is not essential that an element of the same type but with a smaller ordinal exists. For example, the term "third mode" is not used with an intention that a second mode certainly exists along with the third mode. In addition, ordinals can be changed, deleted, and added as necessary.

A general or specific aspect may be implemented as an element, a device, a module, a system, or a method. In addition, a general or specific aspect may be implemented in any combination of an element, a device, a module, a system, and a method.

Hereinafter, embodiments of the present disclosure will be described in detail with reference to the drawings. Note that any of the embodiments described below represents a general or specific example. The numerical values, shapes, materials, constituents, arrangement and forms of connection of the constituents, steps, the orders of the steps, and the like described in the following embodiments are examples, and are not intended to limit the present disclosure. Various aspects described herein can be combined with one another as long as such combinations do not cause discrepancy. In addition, among constituents in the following embodiments, constituents not recited in any of the independent claims each defining the most generic concept are described as optional constituents. In the following description, constituents having substantially the same functions are denoted by the same reference signs, and duplicate descriptions may be omitted.

First Embodiment

FIG. 1 is a schematic diagram illustrating a circuit configuration of an imaging apparatus 1 according to a first embodiment.

In the present embodiment, the imaging apparatus 1 is a stacked solid-state imaging apparatus. The imaging apparatus 1 includes a plurality of pixels 14, drive circuitry, a photoelectric conversion control line 16, a plurality of vertical signal lines 17, a plurality of power supply lines 62, a power supply line 21, a voltage line 75, and a plurality of feedback lines 23.

The plurality of pixels 14 are arranged in two dimensions on a semiconductor substrate 9. Specifically, the plurality of pixels 14 are arranged in a row direction and a column direction. The plurality of pixels 14 form a photosensitive region. The photosensitive region is also referred to as a pixel region. The imaging apparatus 1 may be a line sensor. In this case, the plurality of pixels 14 may be arranged in one dimension.

The drive circuitry sequentially drives the plurality of pixels 14 and reads out signals obtained through photoelectric conversion. The drive circuitry includes a vertical scanner 15, a horizontal signal reader 20, a plurality of column signal processors 19, a plurality of loads 18, and a plurality of differential amplifiers 22. The vertical scanner 15 is also referred to as a row scanning circuit. The horizontal signal reader 20 is also referred to as a column scanning circuit. The column signal processors 19 are also referred to as row signal accumulators. The differential amplifiers 22 are also referred to as feedback amplifiers.

Each pixel 14 has a photoelectric converter 10, an amplification transistor 11, a reset transistor 12, an address transistor 13, an overflow transistor 60, and a metal oxide semiconductor (MOS) capacitor 70. The address transistor 13 is also referred to as a row select transistor. The overflow transistor 60 is also referred to as a burn prevention transistor.

In the present embodiment, the transistors 11, 12, 13, and 60 are metal oxide semiconductor field effect transistors (MOSFETs). Specifically, in the present embodiment, the transistors 11, 12, 13, and 60 are N-type MOSFETs. However, the transistors 11, 12, 13, and 60 may be P-type MOSFETs. The transistors 11, 12, 13, and 60 may be transistors of a type different from MOSFETs, such as bipolar transistors. These points also apply to a band control transistor 56 in a third embodiment.

The power supply line 21 is a line for a source follower power supply. The power supply line 21 supplies a predetermined power supply voltage to each pixel 14.

For each row of the pixels 14, a signal line is provided. The pixels 14 in each row are electrically connected to the vertical scanner 15 via the corresponding signal line.

For each column of the pixels 14, a vertical signal line 17 is provided. The pixels 14 in each column are electrically connected to the corresponding vertical signal line 17.

For each vertical signal line 17, a load 18 is provided. Each load 18 is electrically connected to the corresponding vertical signal line 17. The load 18 forms a source follower circuit in cooperation with the amplification transistor 11.

For each vertical signal line 17, a column signal processer 19 is provided. Each column signal processer 19 is electrically connected to the corresponding vertical signal line 17. These column signal processers 19 are electrically connected to the horizontal signal reader 20. These column signal processers 19 are arranged in a horizontal direction, that is, a row direction.

For each vertical signal line 17, a differential amplifier 22 is provided. The input terminal on the negative side of the differential amplifier 22 is electrically connected to the corresponding vertical signal line 17. A predetermined potential is applied to the input terminal on the positive side of the differential amplifier 22. The output terminal of the differential amplifier 22 is electrically connected to the pixels 14 via the feedback line 23 corresponding to each column.

Figure 2:
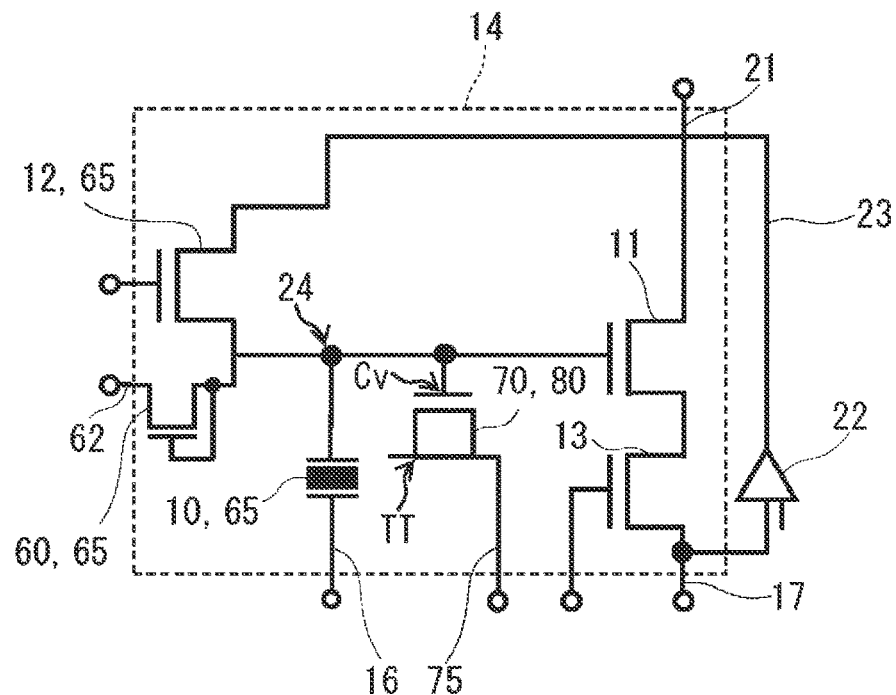
FIG. 2 is a circuit diagram of a pixel according to the first embodiment.

FIG. 2 is a circuit diagram of a pixel 14 according to the first embodiment.

The photoelectric converter 10 is electrically connected to a first one of a source and a drain of the reset transistor 12, a first one of a source and a drain of the overflow transistor 60, a first terminal Cv of the metal oxide semiconductor (MOS) capacitor 70, and a gate electrode of the amplification transistor 11. A first one of a source and a drain of the amplification transistor 11 is electrically connected to the power supply line 21. A second one of the source and the drain of the amplification transistor 11 is electrically connected to a first one of a source and a drain of the address transistor 13. A second one of the source and the drain of the address transistor 13 is electrically connected to the vertical signal line 17. A second one of the source and the drain of the reset transistor 12 is electrically connected to the feedback line 23.

The photoelectric converter 10 converts light to charge. In this way, the photoelectric converter 10 generates charge corresponding to the illuminance of incident light. The charge generated through photoelectric conversion in the photoelectric converter 10 in this way is referred to as signal charge.

In the present embodiment, the signal charge is positive charge. However, the signal charge may be negative charge.

Figure 3:
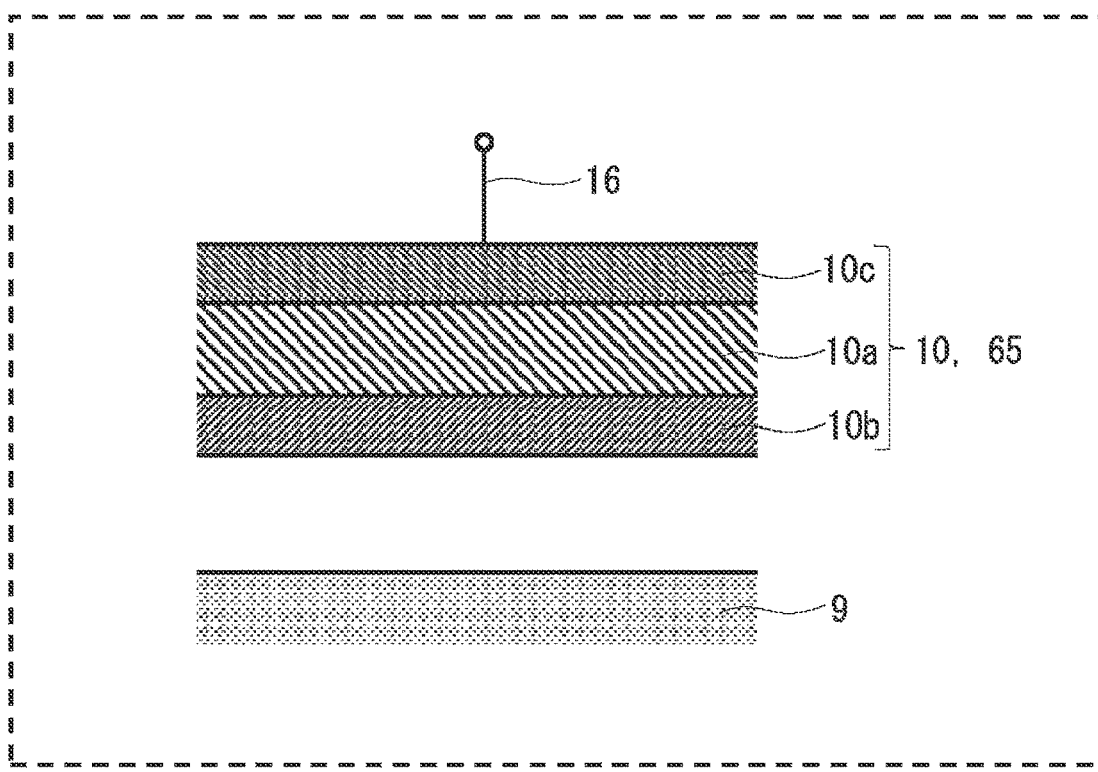
FIG. 3 is a configuration diagram of a photoelectric converter according to the first embodiment.

FIG. 3 is a configuration diagram of the photoelectric converter 10 according to the first embodiment. The photoelectric converter 10 is provided above the semiconductor substrate 9. The photoelectric converter 10 has a photoelectric conversion layer 10a, a pixel electrode 10b, and a counter electrode 10c. The photoelectric conversion layer 10a is disposed between the pixel electrode 10b and the counter electrode 10c. The photoelectric conversion layer 10a generates charge through photoelectric conversion. The pixel electrode 10b collects this charge.

The charge generated through photoelectric conversion is accumulated in a charge accumulator 24. Specifically, the charge generated in the photoelectric converter 10 is accumulated in the charge accumulator 24. The potential of the charge accumulator 24 changes in accordance with the amount of charge accumulated in the charge accumulator 24. In the present embodiment, the charge accumulator 24 is a diffusion region provided in the semiconductor substrate 9.

In the present embodiment, the counter electrodes 10c in the plurality of pixels 14 form a single continuous electrode. In addition, the photoelectric conversion layers 10a in the plurality of pixels 14 form a single continuous film.

The MOS capacitor 70 has the first terminal Cv and a second terminal TT. The first terminal Cv is electrically connected to the charge accumulator 24. The electrical connection between the MOS capacitor 70 and the charge accumulator 24 allows the accumulation of charge to be smoothly shared by the MOS capacitor 70 and the charge accumulator 24 with no disturbance for each pixel. Specifically, the first terminal Cv and the charge accumulator 24 are connected to each other without a switch such as a switching element therebetween.

The MOS capacitor 70 is a variable capacitor. Specifically, the capacitance value of the MOS capacitor 70 changes in accordance with the difference in potential between the first terminal Cv and the second terminal TT.

The imaging apparatus 1 includes a voltage source 77. The voltage source 77 applies a potential to the second terminal TT. Specifically, the voltage source 77 applies a potential to the second terminal TT via the voltage line 75. The voltage source 77 may be included in the drive circuitry.

During exposure, the photoelectric converter 10, the charge accumulator 24, and the first terminal Cv are electrically connected. In this configuration, there is no need to dispose a transistor therebetween. This is advantageous from the viewpoint of suppressing variations in output characteristics for the respective pixels 14. Note that in the case where the photoelectric converter 10 has the photoelectric conversion layer 10a, the pixel electrode 10b, and the counter electrode 10c, the "exposure" can be achieved by applying a voltage to the counter electrode 10c.

The MOS capacitor 70 is provided in the semiconductor substrate 9. The photoelectric converter 10 is located at a position separate from the semiconductor substrate 9. According to this configuration, the photoelectric converter 10 is less likely to affect the capacitance value of the MOS capacitor 70 than a configuration in which the photoelectric converter 10 is a photodiode provided in the semiconductor substrate 9.

The amplification transistor 11 outputs an output signal corresponding to the potential of the charge accumulator 24. Specifically, the output signal is a signal voltage.

The address transistor 13 selectively outputs the output signal from the amplification transistor 11. In this way, the output signal is read out from the vertical signal line 17 via the address transistor 13 from the amplification transistor 11.

The reset transistor 12 resets the potential of the charge accumulator 24. It can also be said that the reset transistor 12 resets the signal charge accumulated in the charge accumulator 24.

The overflow transistor 60 turns on (turn-on) when the potential of the charge accumulator 24 reaches a threshold potential. The turn-on of the overflow transistor 60 allows excess charge accumulated in the charge accumulator 24 to be released to the power supply line 62 via the overflow transistor 60. This makes it possible to prevent failures such as burning and the like. The threshold potential is, for example, a power supply potential VDD.

As understood from the above description, in the present embodiment, a setter 65 is configured. The setter 65 sets a range within which the potential of the charge accumulator 24 changes to a range from a first potential to a second potential.

The setter 65 may include the reset transistor 12. In this case, the reset transistor 12 may reset the potential of the charge accumulator 24 to the first potential.

The setter 65 may include the overflow transistor 60. In this case, the overflow transistor 60 may discharge the charge accumulated in the charge accumulator 24 when the potential of the charge accumulator 24 reaches the second potential.

The setter 65 may include the photoelectric converter 10. In this case, the second potential may be applied to the counter electrode 10c.

The difference between the first potential and the second potential is, in one example, greater than or equal to 0 V and less than or equal to 6 V, and in one specific example, greater than or equal to 0.5 V and less than or equal to 4 V. Typically, the absolute value of the first potential is smaller than the absolute value of the second potential. In the case where the signal charge is positive charge, the second potential may be a potential higher than the first potential. In this case, for example, the first potential is greater than or equal to 0 V and less than or equal to 1 V, and the second potential is greater than or equal to 3 V and less than or equal to 6 V. In the case where the signal charge is negative charge, the overflow transistor 60 can be omitted.

In the present embodiment, the charge accumulator 24 is one of the source and the drain of the reset transistor 12. In addition, the charge accumulator 24 is one of the source and the drain of the overflow transistor 60. That is, the charge accumulator 24 functions to accumulate signal charge and also functions as one of the source and the drain of the reset transistor 12 and as one of the source and the drain of the overflow transistor 60.

Hereinafter, the operation of the imaging apparatus 1 will be described.

The vertical scanner 15 applies a row select signal to the gate electrodes of the address transistors 13. The row select signal controls on and off of the address transistors 13. The rows to be read out are scanned in the vertical direction, that is, the column direction, and the row to be read out is selected, in accordance with the row select signal. Output signals are read out from the pixels 14 in the selected row into the vertical signal line 17.

The vertical scanner 15 applies a reset signal to the gate electrodes of the reset transistors 12. The reset signal controls on and off of the reset transistors 12. A row of the pixels 14 to be subjected to a reset operation is selected in accordance with the reset signal.

The photoelectric conversion control line 16 is electrically connected to all the pixels 14. The same constant voltage is applied to all the photoelectric converters 10 in the imaging apparatus 1 through the photoelectric conversion control line 16. As described above, in the present embodiment, the counter electrodes 10c in the plurality of pixels 14 form a single continuous electrode. The constant voltage is applied to the single continuous electrode through the photoelectric conversion control line 16. In the present embodiment, this constant voltage is a positive constant voltage.

As described above, the vertical signal line 17 is electrically connected to the second one of the source and the drain of each of the address transistors 13 in the pixels 14 in the corresponding row. The vertical signal line 17 transmits the output signals read out from the pixels 14 in the column direction, that is, the vertical direction.

The column signal processor 19 conducts noise suppression signal processing, analog-digital conversion (AD conversion), and the like. The noise suppression signal processing is, for example, correlated double sampling.

The horizontal signal reader 20 sequentially reads out signals from the plurality of column signal processors 19 into a horizontal common signal line (not illustrated).

Note that the power supply line 21 is disposed in the vertical direction of the pixels 14 in the photosensitive region. The vertical direction is the vertical direction in the page of FIG. 1. The reason why the power supply line 21 is disposed in the vertical direction is as follows. That is, the pixels 14 are selected for each row. Therefore, if the power supply line 21 were disposed in the row direction, all the pixel drive current in one row would flow into the single line, thus increasing the voltage drop. By disposing the power supply line 21 in the vertical direction, it is possible to avoid such a situation. A common source follower power supply voltage is applied to the amplification transistors 11 of all the pixels 14 through the power supply line 21.

When the address transistor 13 and the reset transistor 12 are in the conduction state, an output signal from the address transistor 13 is supplied to the input terminal on the negative side of the differential amplifier 22. The differential amplifier 22 conducts a feedback operation such that the gate potential of the amplification transistor 11 becomes equal to a predetermined feedback voltage. The feedback voltage is an output voltage of the differential amplifier 22. In the present embodiment, the output voltage of the differential amplifier 22 is a positive voltage.

In the imaging apparatus 1, the pixels 14 in one row selected by the vertical scanner 15 are selected. The signal charge obtained through photoelectric conversion in the photoelectric converters 10 in the selected pixels 14 is amplified by the amplification transistors 11. Output signals corresponding to the signal charge are outputted from the amplification transistors 11 into the vertical signal line 17 via the address transistors 13. Thereafter, the output signals are inputted into the horizontal signal reader 20 via the column signal processor 19, and are selected and outputted by the horizontal signal reader 20.

The signal charge in each pixel 14 is discharged by turning on the reset transistor 12. At this time, thermal noise called kTC noise is generated from the reset transistor 12. This thermal noise remains even when the reset transistor 12 is turned off and the accumulation of the signal charge in the charge accumulator 24 is started.

This thermal noise is suppressed as follows. That is, the vertical signal line 17 is electrically connected to the input terminal on the negative side of the differential amplifier 22. The voltage of the vertical signal line 17, that is, an input voltage to the input terminal on the negative side, is inverted and amplified by the differential amplifier 22. The voltage thus inverted and amplified is fed back to the second one of the source and the drain of the reset transistor 12 via the feedback line 23. In this way, the thermal noise generated in the reset transistor 12 can be suppressed by the negative feedback control. Specifically, the alternating current component of the thermal noise can be fed back to the second one of the source and the drain of the reset transistor 12. In the present embodiment, the direct current component is greater than or equal to 0 V and less than or equal to 1 V as described above.

Figure 4:
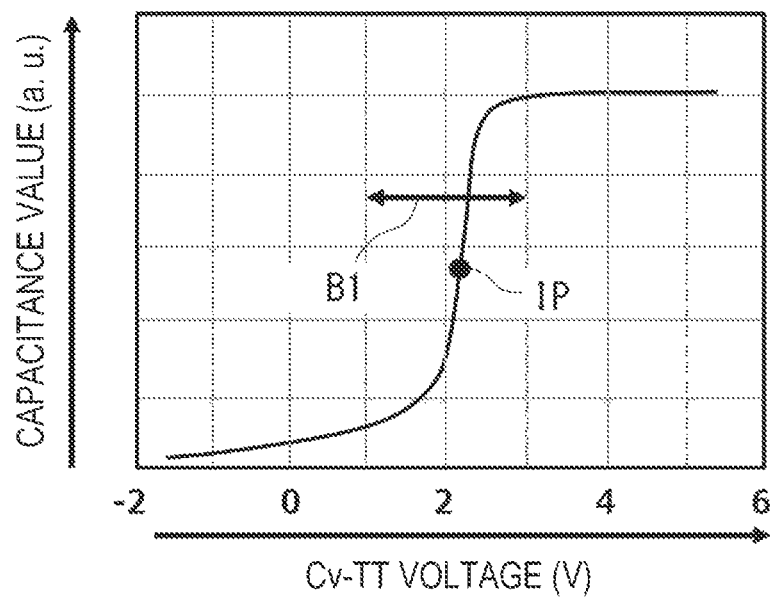
FIG. 4 is a graph showing a relation of a capacitance value to an inter-terminal voltage of a MOS capacitor according to the first embodiment.

Hereinafter, the MOS capacitor 70 will be described. FIG. 4 is a graph showing a relation of the capacitance value to the inter-terminal voltage of the MOS capacitor 70 according to the first embodiment.

In FIG. 4, the horizontal axis indicates the inter-terminal voltage of the MOS capacitor 70. Specifically, the inter-terminal voltage is a difference between the potential of the first terminal Cv and the potential of the second terminal TT. The unit of the horizontal axis is volt (V). The vertical axis indicates the capacitance value of the MOS capacitor 70. The unit of the vertical axis is arbitrary unit (a. u.). These points also apply to FIG. 6, which will be described later.

Hereinafter, the inter-terminal voltage of the MOS capacitor 70 may be referred to as a Cv-TT voltage. The capacitance value of the MOS capacitor 70 may be referred to as a capacitance value C. The relation of the capacitance value C to the Cv-TT voltage may be referred to as C-V characteristics. As understood from FIG. 4, the capacitance value C can change depending on the Cv-TT voltage. In the present embodiment, the MOS capacitor 70 is a variable capacitor because of such C-V characteristics.

In the present embodiment, the capacitance value C continuously changes in accordance with the Cv-TT voltage. Specifically, when the Cv-TT voltage continuously changes, the capacitance value C continuously changes. These characteristics are suitable for achieving a wide dynamic range while ensuring a S/N ratio at an intermediate illuminance. In this context, the intermediate illuminance means an illuminance that is greater than the lowest illuminance with which the imaging apparatus 1 exhibits sensitivity and less than the highest illuminance with which the imaging apparatus 1 exhibits sensitivity. Hereinafter, the reason why such an advantage can be achieved will be described.

Figure 5:
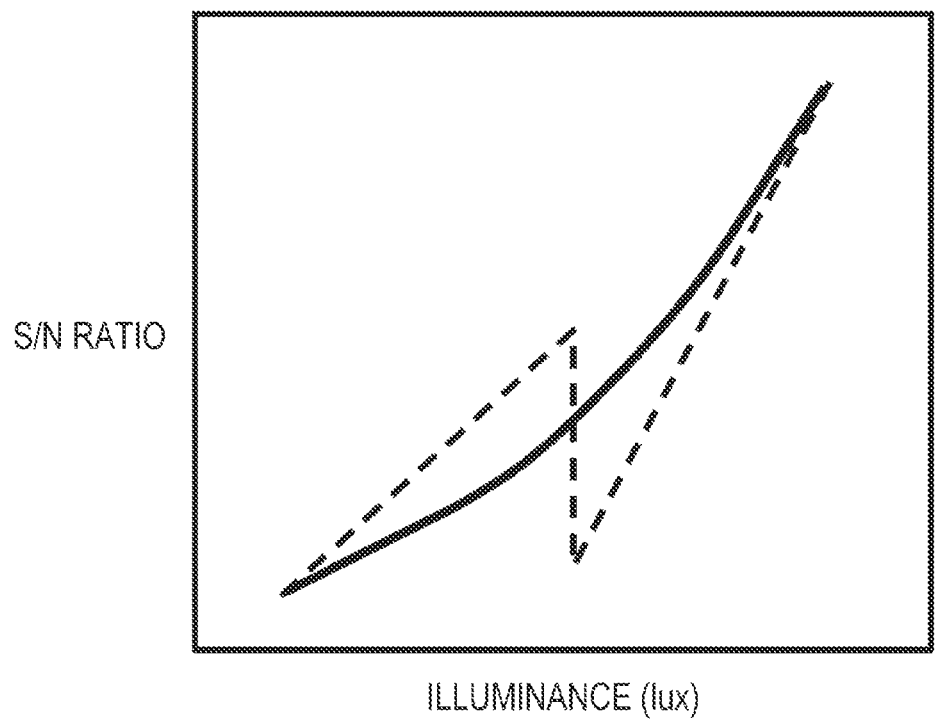
FIG. 5 is a graph showing a relation of a S/N ratio to an illuminance.

FIG. 5 is a graph showing a relation of a S/N ratio to an illuminance. In FIG. 5, the horizontal axis indicates the illuminance. The unit of the horizontal axis is lux. The vertical axis indicates the S/N ratio. The solid line indicates a relation of the S/N ratio to the illuminance for the imaging apparatus 1 of the present embodiment. The dotted line indicates a relation of the S/N ratio to the illuminance for a conventional one-pixel two-cell imaging apparatus. The one-pixel two-cell imaging apparatus is described in, for example, Japanese Unexamined Patent Application Publication No. 2018-117347.

In the one-pixel two-cell system, a first imaging cell and a second imaging cell are configured in one pixel. The first imaging cell is a cell that is used when the illuminance is low, and has high sensitivity and low saturation. The second imaging cell is a cell that is used when the illuminance is high, and has low sensitivity and high saturation. In the one-pixel two-cell system, a wide dynamic range is achieved by using the first imaging cell and the second imaging cell. However, the one-pixel two-cell system has a problem in that there is a tendency that the S/N ratio becomes low and the image quality deteriorates at an intermediate illuminance. Specifically, in the one-pixel two-cell system, data based on signals derived from the first imaging cell for low illuminance and data based on signals derived from the second imaging cell for high illuminance are joined by software at an illuminance corresponding to the intermediate illuminance. At the intermediate illuminance at which this joint portion is formed, the S/N ratio for signals derived from the first imaging cell is high, while the S/N ratio for signals derived from the second imaging cell is low. As also understood from FIG. 5, the S/N ratio rapidly drops at the intermediate illuminance.

In contrast, in the present embodiment, it is possible to continuously increase the capacitance value C with increasing illuminance. This makes it possible to achieve a wide dynamic range while achieving a "seamless" range of S/N ratios in which there is no rapid drop in S/N ratio at an intermediate illuminance.

The advantages of the present embodiment can also be described from a different viewpoint.

In a typical stacked imaging apparatus, charge accumulated in a charge accumulator cannot be completely transferred. For this reason, a configuration in which noise cancelling is conducted through feedback loop may be employed. When the capacitance value of the charge accumulator is reduced, it is easier to ensure the efficiency of noise cancelling. In addition, when the capacitance value of the charge accumulator is reduced, it is easier to ensure a conversion gain. The configuration in which the capacitance value of the charge accumulator is small is suitable for imaging in a dark scene. On the other hand, when the capacitance value of the charge accumulator is increased, it is possible to slow a change in the potential of the charge accumulator with a change in the amount of signal charge accumulated in the charge accumulator. This means that the imaging apparatus has high saturation. The configuration in which the capacitance value of the charge accumulator is large is suitable for imaging in a bright scene. It can also be said that the configuration in which the capacitance value of the charge accumulator is large makes it possible to achieve a wide dynamic range. As described above, both the configuration in which the capacitance value of the charge accumulator is small and the configuration in which the capacitance value of the charge accumulator is large have advantages and disadvantages.

In contrast, in the present embodiment, when feedback operation is conducted, it is possible to reduce the capacitance value C of the MOS capacitor 70. In imaging in a dark scene, the conversion gain can be ensured by reducing the capacitance value C. On the other hand, in imaging in a bright scene, the saturation level of the imaging apparatus 1 can be enhanced by increasing the capacitance value C. According to the present embodiment, the imaging apparatus 1 combining such advantages can be achieved. Specifically, since the capacitance value C of the MOS capacitor 70 continuously changes, it is possible to achieve a wide dynamic range while suppressing an effect of noise.

In the present embodiment, the capacitance value C continuously changes in accordance with the potential of the charge accumulator 24. Specifically, when the potential of the charge accumulator 24 continuously changes, the capacitance value C continuously changes. These characteristics are suitable for achieving a wide dynamic range while ensuring a S/N ratio at an intermediate illuminance.

Specifically, a potential is applied to the second terminal TT such that the capacitance value C continuously changes in accordance with the potential of the charge accumulator 24. In addition, specifically, a potential is applied to the second terminal TT such that when the potential of the charge accumulator 24 continuously changes, the capacitance value C continuously changes.

In the present embodiment, the C-V characteristic of the MOS capacitor 70 has an inflection point IP. When the potential of the charge accumulator 24 continuously changes, the Cv-TT voltage and the capacitance value C continuously change across the inflection point IP. This configuration makes it easy to largely change the capacitance value C of the MOS capacitor 70 in accordance with the change in the potential of the charge accumulator 24. Specifically, a potential is applied to the second terminal TT such that when the potential of the charge accumulator 24 continuously changes, the Cv-TT voltage and the capacitance value C continuously change across the inflection point IP. In this context, the inflection point IP is a point at which the sign of a value obtained by conducting second order differentiation on the capacitance value C with the Cv-TT voltage changes.

In the present embodiment, the C-V characteristic of the MOS capacitor 70 includes a first band B1. The first band B1 has the inflection point IP. When the potential of the charge accumulator 24 changes from a first potential to a second potential, the Cv-TT voltage and the capacitance value C change from values at a first end of the first band B1 to values at a second end of the first band B1. Specifically, a potential is applied to the second terminal TT such that when the potential of the charge accumulator 24 changes from the first potential to the second potential, the Cv-TT voltage and the capacitance value C change from values at the first end of the first band B1 to values at the second end of the first band B1.

In the present embodiment, a first direct current potential is applied to the second terminal TT such that the capacitance value C continuously changes in accordance with the Cv-TT voltage. This configuration is simple. The first direct current potential is, for example, greater than or equal to 0 V and less than or equal to 2 V. Specifically, the first direct current potential is applied to the second terminal TT such that when the potential of the charge accumulator 24 continuously changes, the capacitance value C continuously changes.

In the first band B1 according to the example shown in FIG. 4, when the Cv-TT voltage increases, the capacitance value C continuously and monotonically changes. Here, the monotonic change means that the capacitance value C keeps increasing or keeps decreasing. The first band B1 may be referred to as a variable capacitance band. Specifically, in the first band B1 of the present embodiment, when the Cv-TT voltage increases, the capacitance value C continuously and monotonically increases.

In the specific example shown in FIG. 4, the first potential is 1 V. The second potential is 3 V. The potential to be applied to the second terminal TT is 0 V. The variable capacitance band is a band in which the Cv-TT voltage is greater than or equal to 1 V and less than 3 V.

In the present embodiment, the imaging apparatus 1 includes a specific transistor 80. The specific transistor 80 is typically a MOSFET including a gate, an oxide layer, and at least one semiconductor region. The MOS capacitor 70 is configured by using the specific transistor 80. The source region and the drain region of the specific transistor 80 are electrically connected to each other. Electrically connecting the source region and the drain region of the specific transistor 80 is suitable for achieving the C-V characteristic of the MOS capacitor 70 shown in FIG. 4. The source region and the drain region of the specific transistor 80 may be electrically connected with a line or the like. The specific transistor 80 may include a source/drain region which is a single semiconductor region in which a source region and a drain region are integrated, in place of the source region and the drain region.

In the present embodiment, a first one of the first terminal Cv and the second terminal TT is electrically connected to the source and drain of the specific transistor 80. A second one of the first terminal Cv and the second terminal TT is electrically connected to the gate electrode of the specific transistor 80. In the example of FIGS. 1 and 2, the second terminal TT is electrically connected to the source and drain of the specific transistor 80. The first terminal Cv is electrically connected to the gate electrode of the specific transistor 80. The specific transistor 80 may be provided in the semiconductor substrate 9.

In the present embodiment, the imaging apparatus 1 has a first mode as an imaging mode. In the first mode, when the potential of the charge accumulator 24 continuously changes, the capacitance value C of the MOS capacitor 70 continuously changes. Specifically, in the first mode, the potential is applied to the second terminal TT such that when the potential of the charge accumulator 24 continuously changes, the capacitance value C of the MOS capacitor 70 continuously changes.

Hereinafter, several other embodiments will be described. In the following description, elements common to the embodiment that has already been described and embodiments that are to be subsequently described are denoted by the same reference signs, and descriptions of these may be omitted. The descriptions regarding the respective embodiments may be applied to each other as long as there is no technical discrepancy. The embodiments may be combined with each other as long as there is no technical discrepancy.

Second Embodiment

In a second embodiment, the circuit configuration shown in FIGS. 1 and 2 may be used as in the first embodiment. In the second embodiment, the imaging apparatus 1 has, as imaging modes, a second mode and a third mode besides the first mode.

Figure 6:
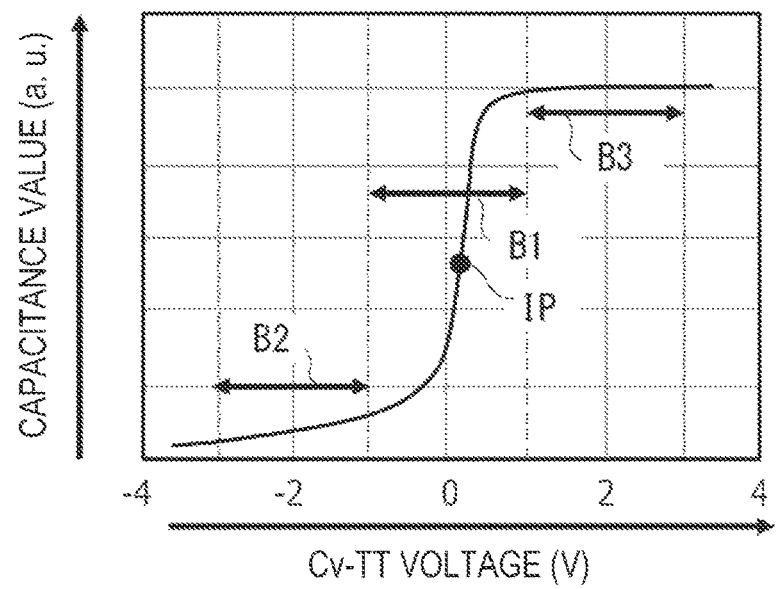
FIG. 6 is a graph showing a relation of a capacitance value to an inter-terminal voltage of a MOS capacitor according to a second embodiment.

FIG. 6 is a graph showing a relation of the capacitance value to the inter-terminal voltage of the MOS capacitor 70 according to the second embodiment. The C-V characteristic has a second band B2 and a third band B3 besides the first band B1.

In the example of FIG. 6, the second band B2 is a band in which the Cv-TT voltage is lower than that in the first band B1. The third band B3 is a band in which the Cv-TT voltage is higher than that in the first band B1.

In the example of FIG. 6, the second band B2 adjoins the first band B1. The third band B3 adjoins the first band B1. However, the second band B2 may be separate from the first band B1. The third band B3 may be separate from the first band B1.

In the first mode, a potential is applied to the second terminal TT such that when the potential of the charge accumulator 24 changes, the Cv-TT voltage changes within the first band B1. In the second mode, a potential is applied to the second terminal TT such that when the potential of the charge accumulator 24 changes, the Cv-TT voltage changes within the second band B2. In the third mode, a potential is applied to the second terminal TT such that when the potential of the charge accumulator 24 changes, the Cv-TT voltage changes within the third band B3.

In the second band B2, the capacitance value C is smaller than that in the first band B1. In addition, in the second band B2, the absolute value of the proportion of a change in the capacitance value C to a change in the Cv-TT voltage is smaller than that in the first band B1. For this reason, in the second mode, it is easy to conduct imaging with high sensitivity and low saturation while suppressing at least one selected from a variation in noise and a variation in signal. Note that the proportion of a change in the capacitance value C to a change in the Cv-TT voltage is a value obtained by differentiating the capacitance value C with respect to the Cv-TT voltage.

In the third band B3, the capacitance value C is larger than that in the first band B1. In addition, in the third band B3, the absolute value of the proportion of a change in the capacitance value C to a change in the Cv-TT voltage is smaller than that in the first band B1. For this reason, in the third mode, it is easy to conduct imaging with low sensitivity and high saturation while suppressing at least one selected from a variation in noise and a variation in signal.

In the present embodiment, the charge to be accumulated in the charge accumulator 24 is positive charge. The potential of the second terminal TT in the second mode is higher than the potential of the second terminal TT in the first mode. The potential of the second terminal TT in the third mode is lower than the potential of the second terminal TT in the first mode.

In a modification, the charge to be accumulated in the charge accumulator 24 is negative charge. The potential of the second terminal TT in the second mode is lower than the potential of the second terminal TT in the first mode. The potential of the second terminal TT in the third mode is higher than the potential of the second terminal TT in the first mode.

In the first mode, a first direct current potential is applied to the second terminal TT such that when the potential of the charge accumulator 24 changes, the Cv-TT voltage changes within the first band B1. In the second mode, a second direct current potential is applied to the second terminal TT such that when the potential of the charge accumulator 24 changes, the Cv-TT voltage changes within the second band B2. In the third mode, a third direct current potential is applied to the second terminal TT such that when the potential of the charge accumulator 24 changes, the Cv-TT voltage changes within the third band B3. This configuration is simple.

In the first band B1 according to the example shown in FIG. 6, when the Cv-TT voltage increases, the capacitance value C continuously and monotonically changes. The first band B1 may be referred to as a variable capacitance band. Specifically, in the first band B1 of the present embodiment, when the Cv-TT voltage increases, the capacitance value C continuously and monotonically increases. On the other hand, the second band B2 may be referred to as a low-capacitance stable band. The third band B3 may be referred to as a high-capacitance stable band.

The Cv-TT voltage corresponding to the first band B1 in the second embodiment is different from the Cv-TT voltage corresponding to the first band B1 in the first embodiment. The Cv-TT voltage corresponding to the first band B1 can be adjusted, for example, by adjusting the amount of impurity injected into the MOS capacitor 70. The same applies to the Cv-TT voltage corresponding to the second band B2 and the Cv-TT voltage corresponding to the third band B3. However, the Cv-TT voltage corresponding to the first band B1 in the second embodiment may be equal to the Cv-TT voltage corresponding to the first band B1 in the first embodiment.

In the second embodiment, the first direct current potential is, for example, greater than or equal to 1 V and less than or equal to 3 V. The second direct current potential is, for example, greater than or equal to 3 V and less than or equal to 5 V. The third direct current potential is, for example, greater than or equal to 0 V and less than or equal to 1 V.

In the specific example shown in FIG. 6, the first potential is 1 V. The second potential is 3 V. The potential to be applied to the second terminal TT in the first mode is 2 V. The potential to be applied to the second terminal TT in the second mode is 4 V. The potential to be applied to the second terminal TT in the third mode is 0 V. The variable capacitance band is a band in which the Cv-TT voltage is greater than or equal to −1 V and less than 1 V. The low-capacitance stable band is a band in which the Cv-TT voltage is greater than or equal to −3 V and less than −1 V. The high-capacitance stable band is a band in which the Cv-TT voltage is greater than or equal to 1 V and less than 3 V.

In the present embodiment, the imaging apparatus 1 switches the potential to be applied to the second terminal TT in accordance with the output signal outputted from the amplification transistor 11. In this way, the imaging apparatus 1 switches the imaging mode.

As described with reference to FIG. 6, various potentials may be applied to the second terminal TT of the MOS capacitor 70. Technically, the C-V characteristic changes due to the back-bias effect of the MOS capacitor 70 in accordance with the potential applied to the second terminal TT. In a typical example, when the potential applied to the second terminal TT is increased, the C-V characteristic curve in FIG. 6 shifts to the right as a whole. However, it is possible to adjust the capacitance value C of the MOS capacitor 70 to a desired value by setting the potential to be applied to the second terminal TT in consideration of this shift.

In one example, the photosensitive region is divided into a plurality of sections. A common potential to be applied to the second terminals TT of the MOS capacitors 70 of the plurality of pixels 14 belonging to a certain section and a common potential to be applied to the second terminals TT of the MOS capacitors 70 of the plurality of pixels 14 belonging to another section can be set independently from each other. For example, a first common potential is applied to the second terminals TT of the MOS capacitors 70 of the plurality of pixels 14 belonging to a first section. A second common potential is applied to the second terminals TT of the MOS capacitors 70 of the plurality of pixels 14 belonging to a second section. A third common potential is applied to the second terminals TT of the MOS capacitors 70 of the plurality of pixels 14 belonging to a third section. The first common potential, the second common potential, and the third common potential can be set independently from one another. This configuration makes it possible to set which band of the C-V characteristic of the MOS capacitors 70 is used for each section. For example, the imaging apparatus 1 can be operated such that the first band B1 is used in the first section, the second band B2 is used in the second section, and the third band B3 is used in the third section.

In the above-described example, the photosensitive region is divided into a plurality of sections, and a common potential is applied to the second terminals TT of the MOS capacitors 70 of the plurality of pixels 14 belonging to each section. This makes it possible to adjust the sensitivity and the saturation level for each section while preventing the control from becoming excessively complicated. However, it is also possible to apply potentials independent from one another to the second terminals TT of the MOS capacitors 70 in the respective pixels 14.

Third Embodiment

Figure 7:
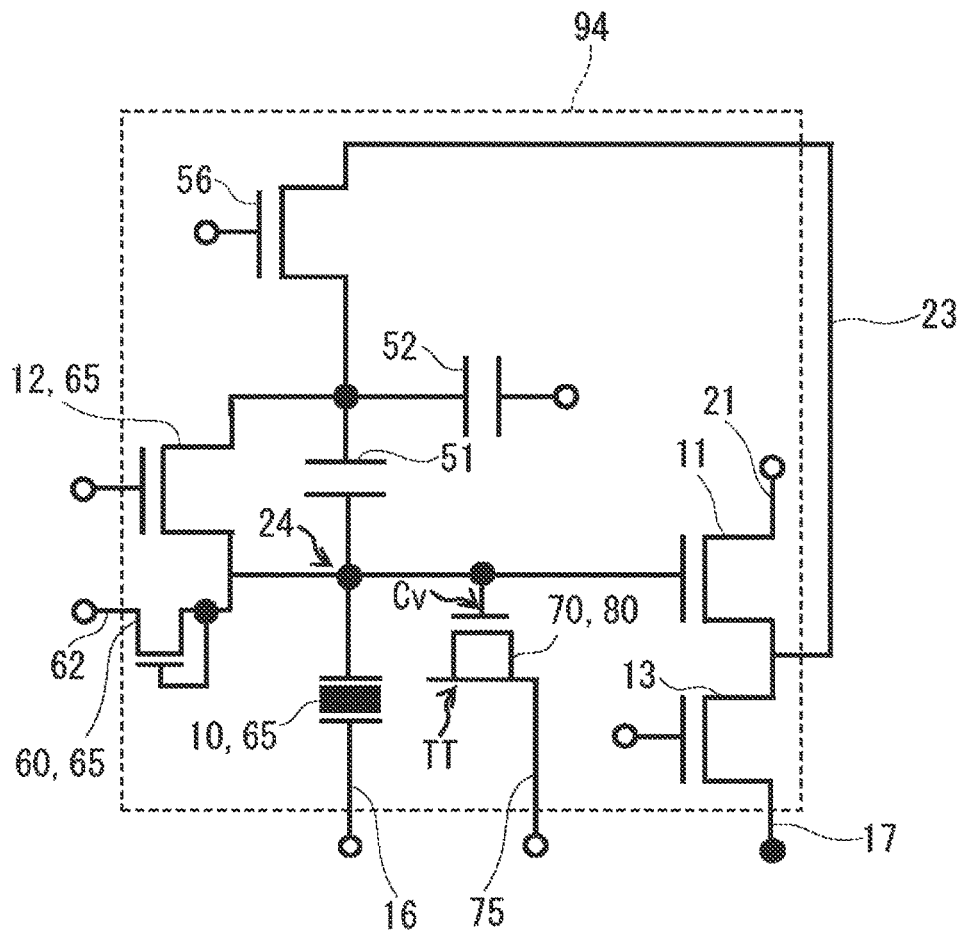
FIG. 7 is a circuit diagram of a pixel according to a third embodiment.

FIG. 7 is a circuit diagram of a pixel 94 according to a third embodiment. The pixel 94 further includes a band control transistor 56, a first capacitor element 51, and a second capacitor element 52 in addition to the amplification transistor 11, the address transistor 13, the reset transistor 12, and the overflow transistor 60.

The gate electrode of the amplification transistor 11, the charge accumulator 24, the first terminal Cv of the MOS capacitor 70, the photoelectric converter 10, and a first end of the first capacitor element 51 are electrically connected. A first one of a source and a drain of the amplification transistor 11 is electrically connected to the power supply line 21. In the present embodiment as well, the charge accumulator 24 is a first one of a source and a drain of the reset transistor 12, and is also a first one of a source and a drain of the overflow transistor 60. A second one of the source and the drain of the reset transistor 12, a first one of a source and a drain of the band control transistor 56, a second end of the first capacitor element 51, and a first end of the second capacitor element 52 are electrically connected. A direct current potential is applied to a second end of the second capacitor element 52. A second one of the source and the drain of the amplification transistor 11, a first one of a source and a drain of the address transistor 13, and a second one of the source and the drain of the band control transistor 56 are electrically connected. A second one of the source and the drain of the address transistor 13 is electrically connected to the vertical signal line 17.

In order to suppress kTC noise generated when the reset transistor 12 is turned off, the band control transistor 56, the first capacitor element 51, and the second capacitor element 52 are used. Regarding the details of the technique for suppressing kTC noise, reference may be made to Japanese Unexamined Patent Application Publication No. 2018-117347 and the like.

The C-V characteristic of the MOS capacitor 70 of the third embodiment is the same as the C-V characteristic of the MOS capacitor 70 of the second embodiment, which has been described with reference to FIG. 6. In the third embodiment, a potential may be applied to the second terminal TT in the same manner as in the second embodiment. However, in the circuit configuration of the third embodiment shown in FIG. 7, the MOS capacitor 70 may be used in the same manner as in the first embodiment.

It is possible to apply various modifications to the techniques described in the first embodiment to the third embodiment.

Some of the elements shown in the drawings may be omitted. For example, the overflow transistor 60 may be omitted.

The photoelectric converter 10 may be a photodiode provided in the semiconductor substrate 9. The imaging apparatus 1 may include a transfer transistor.

Here, the expression "a charge accumulator in which charge generated through photoelectric conversion is accumulated" will be described. The charge accumulator 24 described with reference to FIG. 1, FIG. 2, and FIG. 7 may correspond to the charge accumulator according to this expression. In addition, in an embodiment in which the photoelectric converter 10 is a photodiode, the photodiode may accumulate charge generated through photoelectric conversion. In this embodiment, the photodiode serving as the photoelectric converter 10 may correspond to the charge accumulator according to the above-described expression. The first terminal Cv of the MOS capacitor 70 may be electrically connected to this photodiode.

A C-E characteristic is defined as a relation of the capacitance value C of the MOS capacitor 70 to the potential of the charge accumulator 24. The expression "the capacitance value C continuously changes in accordance with the potential of the charge accumulator 24" will be described. This expression means that in the above-described C-E characteristic, the capacitance value C of the MOS capacitor 70 continuously changes in accordance with the potential of the charge accumulator 24. This expression is not intended to make it essential that the potential of the photoelectric converter 10 continuously change with time as the photoelectric conversion in the photoelectric converter 10 proceeds. For example, an embodiment is considered in which the photoelectric converter 10 and the charge accumulator 24 are connected via a transfer transistor, and charge in the photoelectric converter 10 is transferred to the charge accumulator 24 by the transfer transistor turning on (turn-on), so that the potential of the charge accumulator 24 changes stepwise. In this embodiment as well, it is possible to achieve the feature that "the capacitance value C of the MOS capacitor 70 continuously changes in accordance with the potential of the charge accumulator 24". The same applies to the feature that "when the potential of the charge accumulator 24 continuously changes, the capacitance value C of the MOS capacitor 70 continuously changes".

The expression "the capacitance value C continuously changes in accordance with the potential of the charge accumulator 24" will be further described. This expression means that in at least part of the above-described C-E characteristic, the capacitance value C continuously changes in accordance with the potential of the charge accumulator 24. The same applies to the expression "when the potential of the charge accumulator 24 continuously changes, the capacitance value C continuously changes".

The expression "the capacitance value C continuously changes in accordance with the Cv-TT voltage" will be described. This expression means that in at least part of the C-V characteristic of the MOS capacitor 70, the capacitance value C continuously changes in accordance with the Cv-TT voltage. The same applies to the expression "when the Cv-TT voltage continuously changes, the capacitance value C continuously changes".

The imaging apparatuses according to the above embodiments of the present disclosure are useful in, for example, image sensors, digital cameras, and the like. The imaging apparatuses according to the above embodiments of the present disclosure can be used in cameras for medical use, cameras for robots, security cameras, cameras mounted and used on vehicles, and the like.

What is claimed is:

1. An imaging apparatus comprising:
a photoelectric converter that generates charge through photoelectric conversion;
a charge accumulator in which the charge is accumulated; and
a metal-oxide-semiconductor (MOS) capacitor including a first terminal, a second terminal and an oxide layer, wherein;
during exposure, the first terminal is electrically connected to the charge accumulator,
the oxide layer is located between the first terminal and the second terminal,
a C-V characteristic that is defined as a relation of a capacitance value of the MOS capacitor to an inter-terminal voltage includes an inflection point, the inter-terminal voltage being a voltage between the first terminal and the second terminal, and
when a potential of the charge accumulator continuously changes, the inter-terminal voltage and the capacitance value continuously change across the inflection point.

2. The imaging apparatus according to claim 1, wherein the capacitance value of the MOS capacitor continuously changes in accordance with the potential of the charge accumulator.

3. The imaging apparatus according to claim 1, further comprising:
a setter that sets a range within which the potential of the charge accumulator changes to a range from a first potential to a second potential, wherein
the C-V characteristic includes a first band including the inflection point, and
when the potential of the charge accumulator changes from the first potential to the second potential, the inter-terminal voltage and the capacitance value change from the inter-terminal voltage and the capacitance value at a first end of the first band to the inter-terminal voltage and the capacitance value at a second end of the first band.

4. The imaging apparatus according to claim 1, wherein
a first direct current potential is applied to the second terminal such that the capacitance value of the MOS capacitor continuously changes in accordance with the inter-terminal voltage.

5. The imaging apparatus according to claim 1, further comprising:
an amplification transistor that outputs an output signal corresponding to a potential of the charge accumulator, wherein
the imaging apparatus switches a potential to be applied to the second terminal in accordance with the output signal.

6. The imaging apparatus according to claim 1, further comprising:
a voltage source that applies a potential to the second terminal.

7. The imaging apparatus according to claim 1, further comprising:
a semiconductor substrate including at least one semiconductor region functioning as the second terminal, wherein
the photoelectric converter is separate from the semiconductor substrate.

8. The imaging apparatus according to claim 1, wherein
the MOS capacitor comprises a MOS transistor having a gate functioning as the first terminal, the oxide layer and at least one semiconductor region functioning as the second terminal.

9. The imaging apparatus according to claim 8, wherein
the MOS transistor has a source and a drain electrically connected to each other.

10. An imaging apparatus comprising:
a photoelectric converter that generates charge through photoelectric conversion;
a charge accumulator in which the charge is accumulated; and
a metal-oxide-semiconductor (MOS) capacitor including a first terminal, a second terminal and an oxide layer, wherein:
during exposure, the first terminal is electrically connected to the charge accumulator,
the oxide layer is located between the first terminal and the second terminal,
a C-V characteristic that is defined as a relation of a capacitance value of the MOS capacitor to an inter-terminal voltage includes a first band and a second band, the inter-terminal voltage being a voltage between the first terminal and the second terminal,
the capacitance value in the second band is smaller than the capacitance value in the first band,
an absolute value of a proportion of a change in the capacitance value to a change in the inter-terminal voltage in the second band is smaller than an absolute value of a proportion of a change in the capacitance value to a change in the inter-terminal voltage in the first band,
imaging modes of the imaging apparatus include a first mode and a second mode,
in the first mode, a potential is applied to the second terminal such that when a potential of the charge accumulator changes, the inter-terminal voltage changes within the first band, and
in the second mode, a potential is applied to the second terminal such that when the potential of the charge accumulator changes, the inter-terminal voltage changes within the second band.

11. The imaging apparatus according to claim 10, wherein
the MOS capacitor comprises a MOS transistor having a gate functioning as the first terminal, the oxide layer and at least one semiconductor region functioning as the second terminal.

12. The imaging apparatus according to claim 11, wherein
the MOS transistor has a source and a drain electrically connected to each other.

13. The imaging apparatus according to claim 10, further comprising:
an amplification transistor that outputs an output signal corresponding to a potential of the charge accumulator, wherein
the imaging apparatus switches a potential to be applied to the second terminal in accordance with the output signal.

14. The imaging apparatus according to claim 10, further comprising:
a semiconductor substrate including at least one semiconductor region functioning as the second terminal, wherein
the photoelectric converter is separate from the semiconductor substrate.

15. An imaging apparatus comprising:
a photoelectric converter that generates charge through photoelectric conversion;
a charge accumulator in which the charge is accumulated; and
a metal-oxide-semiconductor (MOS) capacitor including a first terminal, a second terminal and an oxide layer wherein:
during exposure, the first terminal is electrically connected to the charge accumulator,
the oxide layer is located between the first terminal and the second terminal,
a C-V characteristic that is defined as a relation of a capacitance value of the MOS capacitor to an inter-terminal voltage includes a first band and a third band, the inter-terminal voltage being a voltage between the first terminal and the second terminal,
the capacitance value in the third band is larger than the capacitance value in the first band,
an absolute value of a proportion of a change in the capacitance value to a change in the inter-terminal voltage in the third band is smaller than an absolute value of a proportion of a change in the capacitance value to a change in the inter-terminal voltage in the first band,
imaging modes of the imaging apparatus include a first mode and a third mode,
in the first mode, a potential is applied to the second terminal such that when a potential of the charge accumulator changes, the inter-terminal voltage changes within the first band, and
in the third mode, a potential is applied to the second terminal such that when the potential of the charge accumulator changes, the inter-terminal voltage changes within the third band.

16. The imaging apparatus according to claim 15, wherein
the MOS capacitor comprises a MOS transistor having a gate functioning as the first terminal, the oxide layer and at least one semiconductor region functioning as the second terminal.

17. The imaging apparatus according to claim 16, wherein
the MOS transistor has a source and a drain electrically connected to each other.

18. The imaging apparatus according to claim 15, further comprising:
    an amplification transistor that outputs an output signal corresponding to a potential of the charge accumulator, wherein
    the imaging apparatus switches a potential to be applied to the second terminal in accordance with the output signal.

19. The imaging apparatus according to claim 15, further comprising:
    a semiconductor substrate including at least one semiconductor region functioning as the second terminal, wherein
    the photoelectric converter is separate from the semiconductor substrate.

* * * * *